United States Patent [19]

Nomi et al.

[11] Patent Number: 4,916,017
[45] Date of Patent: Apr. 10, 1990

[54] SHEET MATERIAL

[76] Inventors: Haruo Nomi, 15-9, 1-chome, Sakuragaokanishi, Sanyo-cho; Minoru Hatakeyama, 1-22, 7-chome, Sakuragaokanishi, Sanyo-cho, both of Akaiwa-gun, Japan

[21] Appl. No.: 238,748

[22] Filed: Aug. 31, 1988

[30] Foreign Application Priority Data

Sep. 10, 1987 [JP] Japan ................ 62-225387

[51] Int. Cl.⁴ .............. B32B 27/04; B32B 27/08; B32B 27/28
[52] U.S. Cl. .................... 428/413; 428/414; 428/422; 428/473.5
[58] Field of Search ............ 428/413, 414, 422, 473.5

[56] References Cited

U.S. PATENT DOCUMENTS

| | | | |
|---|---|---|---|
| 3,953,566 | 4/1976 | Gore | 428/422 |
| 4,133,927 | 1/1979 | Tomoda | 428/422 |
| 4,443,511 | 4/1984 | Worden et al. | 428/422 |
| 4,692,369 | 9/1987 | Nomi | 428/422 |

Primary Examiner—William J. Van Balen
Attorney, Agent, or Firm—Mortenson & Uebler

[57] ABSTRACT

A composite sheet material is provided comprising a porous, expanded polytetrafluoroethylene base sheet impregnated with a first resin that has a lower heat-shrinkability than the base sheet, the impregnated base sheet having a covering layer which has a thickness of at least three (3) micrometers and which comprises a second resin whose hardening rate is lower than that of the impregnating resin. The present invention is useful in printed circuit boards wherein prepregs according to the invention are laminated with a metal sheet, a resin sheet, or another printed circuit board.

11 Claims, 1 Drawing Sheet

SHEET MATERIAL

BACKGROUND OF THE INVENTION

The present invention concerns a composite sheet material. The object of the present invention is to provide a sheet material which is superior in terms of dimensional stability and shape retention, and which also has stable and superior bonding characteristics.

The present invention provides a synthetic resin sheet which can be bonded to various types of metal sheets or foils, or which can be used for other purposes.

Polytetrafluoroethylene resins have superior heat resistance, chemical resistance and electrical characteristics, and are widely used in a variety of fields. One such polytetrafluoroethylene resin product is porous, expanded polytetrafluoroethylene disclosed in U.S. Pat. No. 3,953,566, incorporated by reference. This substance not only has the abovementioned characteristics of polytetrafluoroethylene, but is also endowed with air permeability, softness, biocompatibility and good bonding characteristics. Accordingly, this material is widely used in waterproof, water-vapor-permeable clothing, artificial blood vessels, various types of filters, and various types of industrial packing.

Specifically, the aforementioned porous, expanded polytetrafluoroethylene has fine continuous pores. Bonding of this material is achieved by an anchoring effect resulting from penetration and fixing within the fine porous structure of the resin. However, since expanded polytetrafluoroethylene intrinsically has an extremely low surface energy, it is difficult to wet the polytetrafluoroethylene with various types of adhesives. As a result, the bonding strength is generally low. Accordingly, in cases where a high bonding strength is required, it is usually necessary to first etch the surface of the expanded polytetrafluoroethylene with an alkali metal or other reactant.

Because the expanded polytetrafluoroethylene exhibits considerable cold flow and thermal expansion, it is generally difficult to use expanded polytetrafluoroethylene in cases where a high degree of dimensional stability is required, and these properties are especially conspicuous in the case of highly porous polytetrafluoroethylene, because this material has numerous pores in its structure. Accordingly, in cases where such highly porous polytetrafluoroethylene is to be utilized in a bonding sheet, a method is generally used in which the porous polytetrafluoroethylene is impregnated with another resin which has a high surface energy.

However, even in the case of materials formed by impregnating porous, expanded polytetrafluoroethylene with another resin as described above, it is extremely difficult to insure that the impregnating resin fills the entire interior of the porous structure of the polytetrafluoroethylene. Because of the poor wetting properties of polytetrafluoroethylene, polytetrafluoroethylene may be exposed at the surface of a composite material thus formed by impregnating porous polytetrafluoroethylene with another resin. If a sheet with polytetrafluoroethylene thus exposed at the surface is used for bonding purposes, the distribution of the adhesive will be nonuniform as a result of the fluid behavior of the impregnating resin. This can lead to unsatisfactory bonding and insufficient strength. For example, in a case where two sheets of sheet iron are thermally bonded to both sides of the aforementioned impregnated polytetrafluoroethylene bonding sheet, the impregnating resin, which has fluidity as a result of softening due to heating, migrates to the iron sheets, which have a high surface energy, so that very little impregnating resin remains on the polytetrafluoroethylene.

The abovementioned phenomenon is especially conspicuous in cases where two or more impregnated polytetrafluoroethylene bonding sheets of the type described above are used stacked together. In such cases, almost no impregnating bonding resin remains at the interfaces between the stacked impregnated polytetrafluoroethylene sheets. As a result, there may be little or no adhesive strength.

Accordingly, although the aforementioned special properties of porous, expanded polytetrafluoroethylene are fully understood, such porous polytetrafluoroethylene suffers from a drawback in that it generally cannot be used as a bonding structural material of the type described above.

SUMMARY OF THE INVENTION

A composite sheet material comprising a porous, expanded polytetrafluoroethylene base sheet impregnated with a first resin that has a lower heat-shrinkability than the base sheet, the impregnated base sheet having a covering layer which has a thickness of at least three (3) micrometers and which comprises a second resin whose hardening rate is lower than that of the impregnating resin. The first resin may be in a semi-hardened state or a fully-hardened state. The second resin may be in a semi-hardened state or a fully-hardened state. The first resin may be a polyimide, epoxy or polybutadiene. The second resin may be an epoxy, phenolic, or a copolymer of tetrafluoroethylene and hexafluoropropylene.

DETAILED DESCRIPTION OF THE INVENTION AND PREFERRED EMBODIMENTS WITH REFERENCE TO THE DRAWINGS

A composite sheet material is provided comprising a porous, expanded polytetrafluoroethylene base sheet impregnated with a first resin that has a lower heat-shrinkability than the base sheet, the impregnated base sheet having a covering layer which has a thickness of at least three (3) micrometers and which comprises a second resin whose hardening rate is lower than that of the impregnating resin.

More specifically, the present invention is a sheet material which is characterized by the fact that a covering layer which has a thickness of three (3) micrometers or greater and which consists of a resin whose hardened state or hardening rate (or both) is (are) lower than that (those) of the impregnating resin mentioned below is formed on at least one surface of a porous polytetrafluoroethylene sheet which is impregnated with a resin liquid that has a smaller heat-shrink capacity than the sheet.

The heat-shrink capacity of porous, expanded polytetrafluoroethylene is controlled by the hardened structure of the aforementioned impregnating resin, thus insuring dimensional stability and shape retention. The formation of a resin covering layer on the aforementioned impregnated sheet containing a hardened impregnating resin as described above results in a restriction of the fluid behavior of the adhesive component during heating, thus preventing a nonuniform distribution of the adhesive component due to such fluid behavior.

Accordingly, a sheet which has high bonding strength, a stable shape and stable bonding characteristics is obtained.

Working examples of the present invention are described below with reference to the accompanying drawings.

Figure 1:
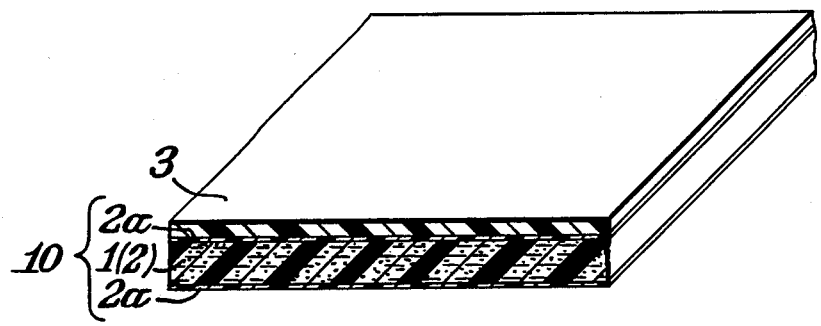
FIG. 1 is a pictorial view, partly in cross-section, of one embodiment of the present invention.

One basic configuration of the present invention is illustrated in FIG. 1. Specifically, a porous, expanded polytetrafluoroethylene sheet 1 is impregnated with a synthetic resin solution 2 which has a lower heat-shrink capacity than the sheet 1, and this resin solution 2 is hardened by heating. Furthermore, a resin covering layer 3 is formed on one side of this impregnated sheet 10. The impregnation of the sheet and the hardening of the aforementioned synthetic resin solution 2 may be performed so that extremely thin films 2a are appropriately formed on the surfaces of the sheet 1.

Figure 2:
FIG. 2 is a pictorial view, partly in cross-section, of another embodiment of the present invention.

The aforementioned resin covering layer 3 may be formed on both surfaces of the impregnated sheet 10 as shown in FIG. 2.

The porous, expanded polytetrafluoroethylene sheet 1 is obtained as follows: an extruded polytetrafluoroethylene film is subjected to a drawing treatment at a prescribed temperature and drawing rate, as set forth in U.S. Pat. No. 3,953,566, thus producing a porous structure in which numerous fibrilized microfibers are formed in spiderweb fashion between countless micronodes. The porosity of this sheet is 50 to 90%, preferably 70 to 80%. The mean pore diameter is 0.1 to 3 micrometers, preferably 0.2 to 0.4 micrometers, and the thickness of the sheet is 50 to 250 micrometers, preferably 50 to 150 micrometers.

In general, various types of thermosetting resin liquids may be used for the synthetic resin liquid having small heat-shrink capacity with which the porous sheet 1 is impregnated. For example, polyimide resins, epoxy resins, polybutadiene resins, polyester resins, triazine resins, bis-maleimidotriazine resins, polyurethane resins and mixtures consisting of two or more such resins may be used. These resins are converted into a solution in an appropriate concentration using one or more solvents such as methyl ethyl ketone, acetone, toluene, xylene, dimethylformamide, dimethylacetamide, and N-methyl-2-pyrrolidone.

The resin covering layer 3 may be a resin whose hardened state or hardening rate (or both) is (are) lower than that (those) of the synthetic resin with which the aforementioned sheet 1 is impregnated. When the aforementioned impregnating resin is in a hardened or semi-hardened state, this resin covering layer is in a semi-hardened or virtually unhardened state, respectively. Alternatively, an impregnating resin and a resin covering layer which have a corresponding difference in hardening rate are used. When resins with different hardening rates are used, e.g., when a resin with a rapid hardening rate such as an epoxy resin with a gelling time of 30 seconds or less, containing 0.4 phr 3-ethyl-4-methylimidazole as a catalyst, is used for the impregnating resin, and a resin with a slow hardening rate such as an epoxy resin with a gelling time of 400 seconds or longer, containing 0.1 phr 2-ethyl-4-methyl-imidazole, is used for the covering layer, the internal impregnated resin will have little fluidity during heating, while the outer covering layer(s) will be highly fluid. Accordingly, when this sheet is joined with an iron sheet, which has a high surface energy, and pressed under heating, the internal impregnated resin will harden with little flow occurring, while the resin covering layer 3 will flow and wet the surface of the iron sheet. The resin covering layer 3 will provide a good bonding joint with the internal impregnated resin so that superior bonding stability results. Such a relationship can generally be obtained if the thickness of the resin covering layer is 3 micrometers or greater. However, a more desirable thickness range is 50 to 100 micrometers. Furthermore, this resin covering layer does not necessarily have to cover the entire surface of the sheet. A stripe-form, lattice-form or spot-form covering layer pattern are also permissible.

Examples of manufacture of the sheet material of the present invention are described below.

EXAMPLE 1

A porous, expanded polytetrafluoroethylene resin sheet 1 with a thickness of 100 micrometers, a mean pore diameter of 0.2 micrometers and a porosity of 80% was impregnated with a polyimide resin using N-methyl-2-pyrrolidone as a solvent at a ratio of 90 g/m$^2$, calculated in terms of resin content.

This impregnated sheet was stretched and fixed in a frame in order to prevent heat-shrinkage of the sheet 1. In this state, the impregnated sheet was successively heat-treated for 40 minutes at 120° C., 20 minutes at 200° C. and 10 minutes at 350° C. This composite sheet 10, impregnated with the aforementioned polyimide resin, was then coated on both surfaces with an epoxy resin solution formed by mixing 100 parts of an epoxy resin, 4.0 parts of dicyandiamide, 15 parts of dimethylformamide, 0.2 parts of benzyldimethylamine and 80 parts of methyl ethyl ketone. The coated sheet 10 was then dried for 8 minutes at 150° C., producing a sheet material such as that shown in FIG. 2 with an internal impregnated resin 2 that had lost virtually all fluidity, and with resin covering layers 3 possessing a high fluidity formed to a mean thickness of 40 micrometers on the external surfaces of the sheet.

Figure 3:
FIG. 3 is a cross-sectional view of the bonded structure described in Example 1 below.

Two sheets of electrolytic copper foil 4, each of which had one roughened surface and a thickness of 70 micrometers, were placed on the respective surfaces of the sheet material obtained as described above, and these sandwiched sheets were hot-pressed for 60 minutes at a temperature of 180° C. and a pressure of 30 kg/cm$^2$, so that the sheets of electrolytic copper foil 4, 4 were bonded as shown in FIG. 3. When the peeling strength of the copper foil 4 was measured after cooling, a value of 1.8 kg/cm$^2$ was obtained.

EXAMPLE 2

The same porous polytetrafluoroethylene sheet 1 used in Example 1 was impregnated with an epoxy resin solution of the composition shown below at a ratio of 106 g/m$^2$. The sheet was then dried for 12 minutes to produce an impregnated sheet 10.

| | |
|---|---|
| Epoxy resin | 100 parts |
| Dicyandiamide | 3.2 parts |
| Dimethylbenzylamine | 0.16 parts |
| Dimethylformamide | 16 parts |
| Methyl ethyl ketone | 5 parts |

The abovementioned impregnated sheet 10 was then coated on both sides with a coating resin solution of the composition shown below, and the coated sheet was dried for 4 minutes at 150° C., so that resin covering layers 3 with a mean thickness of 3 micrometers were formed.

| | |
|---|---|
| Epoxy resin | 100 parts |
| Dicyandiamide | 3.2 parts |
| Dimethylbenzylamine | 0.16 parts |
| Dimethylformamide | 16 parts |
| Xylene | 100 parts |

Figure 4:
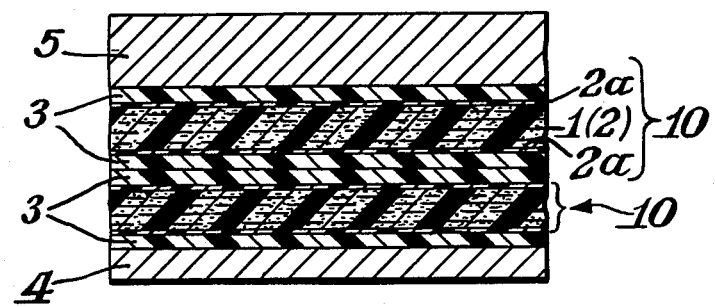
FIG. 4 is a cross-sectional view of the bonded structure described in Example 2 below.

Two sheets of the sheet material thus obtained were stacked together, and these stacked sheets were sandwiched between an aluminum sheet 5 (thickness: 1 mm, alumite-treated surface) and a sheet of electrolytic copper foil 4 (thickness: 35 microns, one surface roughened). These sandwiched sheets were hot-pressed for 60 minutes at a temperature of 180° C. and a pressure of 40 kg/cm², producing a product of the type shown in FIG. 4.

In this product, the bonding between the sheets 10 and 10 was extremely strong, and the peeling strength of the copper foil 4 was 2.0 kg/cm².

For comparison, an epoxy-impregnated polytetrafluoroethylene sheet without the aforementioned resin coverings 3 was manufactured as a comparative example in corresponding to the aforementioned example. In laminating and bonding an aluminum sheet 5 and copper foil 4 to examples of these sheets as described above, three different pressing pressures were used: 20 kg/cm², 40 kg/cm², and 60 kg/cm². Otherwise, a hot-pressing treatment was performed for 60 minutes at 180° C. exactly as described above. In the resulting product, there was almost no adhesive strength between the respective sheets. The sheets were easily peeled apart immediately after bonding.

Furthermore, separately from this comparative example, the same porous polytetrafluoroethylene sheet 1 used in Example 1 was impregnated with the same epoxy impregnating liquid used in Example 2 by the same method used in Example 2. Following this impregnation treatment, both sides of the sheet were coated with the same coating resin used in Example 2, without any drying treatment between impregnation and coating. The coated sheet was then dried for 10 minutes at 150° C., producing a bonding sheet with virtually no difference in hardened state between the resin of the impregnated layer and the coating resin, as a separate comparative example.

The epoxy content of this sheet was 100 g/m². When this sheet was pressed into the same laminated structure as in Example 2, under the same laminating conditions, the bonding between the sheets was unsatisfactory, i.e., the sheets could easily be peeled apart by hand.

EXAMPLE 3

The same porous polytetrafluoroethylene sheet 1 used in Example 1 was impregnated with a polybutadiene solution consisting of 100 parts of a polybutadiene, 0.3 parts of dicumyl peroxide and 30 parts of methl ethyl ketone. The impregnated sheet was dried for 30 minutes at 160° C. This sheet was then coated by means of a roll coater with a coating solution of 100 parts of a phenol novolac type epoxy resin, 10 parts of dicyandiamide, 0.1 parts of 2-ethyl-4-methylimidazole and 50 parts of methyl ethyl ketone. After coating, the sheet was dried for 10 minutes at 150° C., producing a sheet material with a coating layer thickness of 10 micrometers.

A polished stainless steel sheet with a thickness of 1 mm was joined to the coated surface of this sheet material, and the two sheets were bonded by hot-pressing for 60 minutes at a temperature of 180° C. and a pressure of 40 kg/cm². The laminated material thus obtained was very strongly bonded, and showed no abnormalities, even after being treated for 60 seconds in a solder bath at 280° C.

EXAMPLE 4

A porous polytetrafluoroethylene sheet 1 with a thickness of 50 micrometers, a mean pore diameter of 0.5 micrometers and a porosity of 80% was impregnated with a polyimide resin using N-methyl-2-pyrrolidone as a solvent. This impregnated sheet was fixed in a frame and successively heat-treated for 10 minutes at 150° C., 120 minutes at 180° C., and 24 hours at 250° C.

A film (thickness: 6 micrometers) of a copolymer of tetrafluoroethylene and hexafluoropropylene was fused to one surface of this polyimide-impregnated sheet 1 by pressing with hot rolls heated to 350° C., thus producing a sheet material of the present invention.

A copper foil (thickness: 18 micrometers, one surface roughened) was bonded to the abovementioned sheet material via the aforementioned copolymer film surface by hot-pressing for 10 minutes at a temperature of 350° C. and a pressure of 10 kg/cm².

This laminated material was heat-treated for 30 seconds in a solder bath at 270° C. Afterward, no substantial abnormalities were observed.

As described above, the present invention makes it possible to obtain a sheet material which has the heat resistance, chemical resistance and electrical properties of porous polytetrafluoroethylene, and which is also endowed with dimensional stability and shape retention properties. At the same time, flow and nonuniform distribution of the adhesive is effectively prevented, so that a stable bonding strength with respect to various types of metal sheets is obtained. Accordingly, the present invention has great industrial merit, for example, in use in printed circuit boards wherein prepregs according to the invention are laminated with a metal sheet, a resin sheet, or another printed circuit board.

While the invention has been disclosed herein in connection with certain embodiments and detailed descriptions, it will be clear to one skilled in the art that modifications or variations of such details can be made without deviating from the gist of this invention, and such modifications or variations are considered to be within the scope of the claims hereinbelow.

What is claimed is:

1. A composite sheet material comprising a porous, expanded polytetrafluoroethylene base sheet impregnated with a first resin that has a lower heat-shrinkability than said base sheet, said impregnated base sheet having a covering layer which has a thickness of at least three (3) micrometers and which comprises a second resin whose hardening rate is lower than that of said impregnating resin.

2. The composite sheet material of claim 1 wherein said first resin is in a semi-hardened site.

3. The composite sheet material of claim 1 wherein said first resin is in a fully-hardened state.

4. The composite sheet material of claim 1 wherein said second resin is in a semi-hardened state.

5. The composite sheet material of claim 1 wherein said second resin is in a fully-hardened state.

6. The composite sheet material of claim 1 wherein said first resin is a polyimide.

7. The composite sheet material of claim 1 wherein said first resin is an epoxy.

8. The composite sheet material of claim 1 wherein said first resin is polybutadiene.

9. The composite sheet material of claim 1 wherein said second resin is an epoxy.

10. The composite sheet material of claim 1 wherein said second resin is a phenolic.

11. The composite sheet material of claim 1 wherein said second resin is a copolymer of tetrafluoroethylene and hexafluoropropylene.

* * * * *